United States Patent
Shimizu

[11] Patent Number: 6,001,677
[45] Date of Patent: Dec. 14, 1999

[54] METHOD FOR FABRICATING CMOS TRANSISTORS BY IMPLANTING INTO POLYSILICON

[75] Inventor: Akira Shimizu, Toyonaka, Japan

[73] Assignee: Ricoh Company, Ltd., Tokyo, Japan

[21] Appl. No.: 09/065,334

[22] Filed: Apr. 23, 1998

[30] Foreign Application Priority Data

Apr. 25, 1997 [JP] Japan .................................. 9-108450

[51] Int. Cl.$^6$ ............................................. H01L 21/8238
[52] U.S. Cl. ........................ 438/231; 438/275; 438/532
[58] Field of Search .................................. 438/200, 217, 438/230, 231, 232, 275, 279, 532

[56] References Cited

U.S. PATENT DOCUMENTS

| 5,021,356 | 6/1991 | Henderson et al. | 438/532 |
|---|---|---|---|
| 5,468,666 | 11/1995 | Chapman | 438/231 |
| 5,534,448 | 7/1996 | Baldi | 438/217 |
| 5,744,372 | 4/1998 | Bulucea | 438/231 |
| 5,789,286 | 9/1998 | Subbanna | 438/231 |

FOREIGN PATENT DOCUMENTS 7-307442   11/1995   Japan .

*Primary Examiner*—Chandra Chaudhari
*Attorney, Agent, or Firm*—Cooper & Dunham LLP

[57] ABSTRACT

A method for fabricating MOS transistors comprises the steps of forming a polysilicon layer, having an underlying gate oxide layer on the major surface of a silicon substrate, providing a mask to cover a predetermined portion except the portion for an N-type polysilicon layer to be formed, doping the polysilicon layer uncovered by the first mask with N-type ions, providing a second mask to cover a predetermined portion except the portion for a P-type polysilicon layer to be formed, doping the polysilicon layer uncovered by the second mask with boron ions, subjecting the polysilicon layer to a patterning process to define gate electrodes of an NMOS and PMOS transistors, providing a third mask to cover a predetermined portion except the portion for an NMOS transistor to be formed, doping N-type ions into substrate portion for the NMOS transistor to be formed using the third mask and the gate electrodes as a mask to thereby form a source and a drain of the NMOS transistor, forming a silicon oxide layer over each of the gate electrodes, providing a fourth mask to cover a predetermined portion except the portion for a PMOS transistor to be formed, and doping $BF_2$ ions into substrate portion for PMOS transistors to be formed using the fourth mask and gate electrodes overlaid by the silicon oxide layer as a mask, to thereby form source and drain regions of the PMOS transistors.

5 Claims, 6 Drawing Sheets

FIG. 4  GATE OXIDE OF 25 NM THICKNESS
POLYSILICON LAYER OF 400 NM THICKNESS
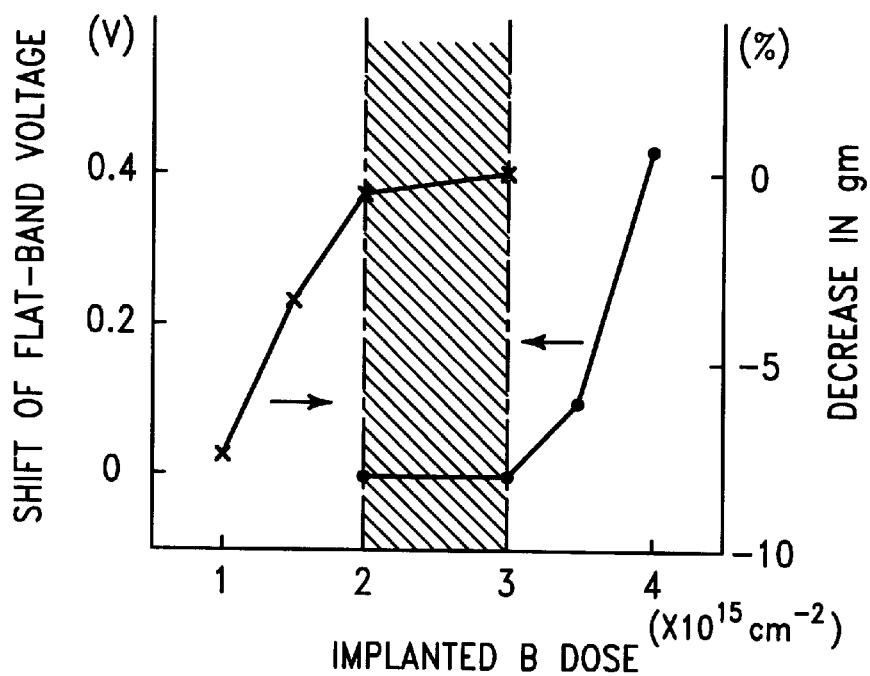
FIG. 5
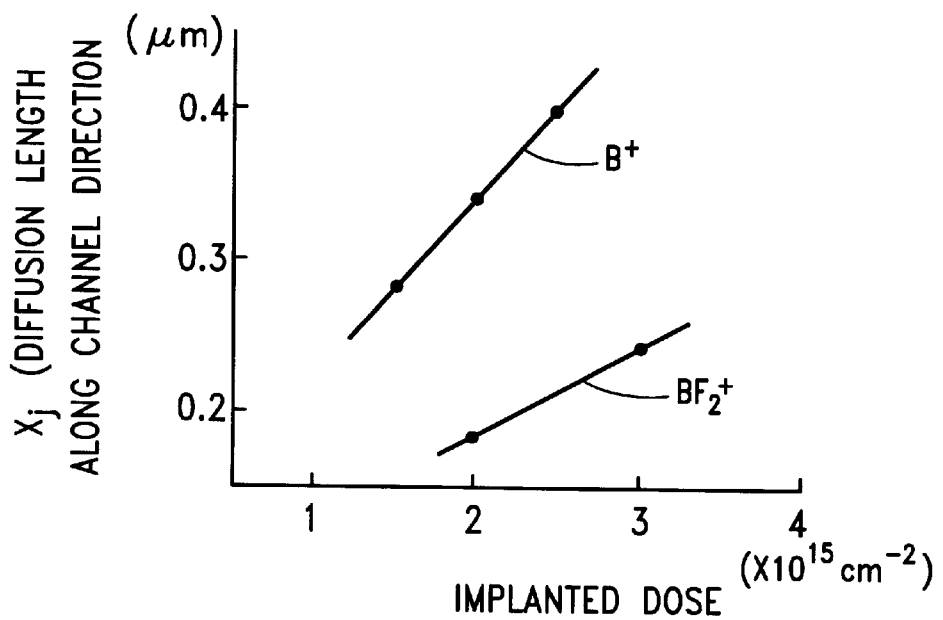

METHOD FOR FABRICATING CMOS TRANSISTORS BY IMPLANTING INTO POLYSILICON

BACKGROUND OF THE INVENTION

1. Field of the Invention

This invention relates generally to a method for fabricating MOS transistors and more particularly, to a method for fabricating low threshold voltage N-channel and P-channel MOS, and CMOS transistors in integrated circuits.

2. Description of the Related Art

Among numerous silicon MOS transistors, CMOS devices formed by the combination of PMOS and NMOS transistors are widely used in view of the low quiescent power consumption and high integration density features.

As the demand for low power consumption has increased, lower supply voltages have become more requisite for CMOS devices. This necessitates that the MOS transistors be operated at lower threshold voltages and this gives rise to the problem such as the increase in power consumption caused by subthreshold leakage currents and the short channel effects.

In the conventional MOS process, a CMOS device is fabricated with gate electrodes of N conductivity type (N-type) polysilicon. However, since a PMOS transistor of the CMOS device is generally designed to be of the buried channel type to facilitate the control threshold voltages, relatively large short channel effects and subthreshold currents are induced in the PMOS transistor because of the buried channel structure.

By contrast, when a gate electrode of the PMOS transistor is composed of P-type polysilicon, the short channel effect can be suppressed since the PMOS may be operated as a surface channel type MOS transistor.

Although either boron (B) or boron difluoride ($BF_2$) may be used as dopants for forming the P-type polysilicon electrode, boron has been used conventionally for the following reasons: The decrease in threshold voltages and device reliability of the PMOS have been found. This is considered to be due to the B penetration into a channel region through a gate oxide layer which is caused by the difference in the amount of B segregation affected by fluorine at the interface between silicon (i.e., channel region) and silicon oxide (gate oxide layer). Therefore, the B dopants have been used conventionally for gate electrode doping. In addition, this B doping has been carried out simultaneously to the source and drain regions of PMOS transistors as well.

However, by this B doping method to the source and drain regions, the formation of shallow junctions in the source and drain regions is difficult, as aforementioned, which is disadvantageous to the device miniaturization. Furthermore, although this B doping is preferred for the fabrication of high withstand voltage MOS transistors, its allowable range in doping concentration is rather limited and can not be decreased enough due to the induction of the carrier depletion in polysilicon gate regions.

Referring to FIGS. 7A through 7D, there are described prior art process steps for fabricating low threshold voltage MOS transistors.

There are formed P-well and N-well regions 2 and 12 on a silicon substrate 1 in the regions 16, 17 and 18 where NMOS and PMOS transistors are to be formed, respectively, as shown in FIG. 7A.

A field oxide layer 4 of silicon oxide for isolation is then formed on a main surface of the well regions by the conventional local oxidation of silicon (LOCOS) process, in which openings for the NMOS and PMOS regions are defined using an oxidation mask film (not shown). Thereafter, a gate oxide layer 3 is formed, wherein channel doping is carried out so as to control threshold voltages of each MOS transistor.

Subsequently, a layer of polysilicon 5 for forming gate electrodes is disposed on the gate oxide layer 3. Since this polysilicon layer is also utilized as a resistor for an analogue circuit which will be described hereinbelow, the entire surface of the polysilicon layer 5 is doped with appropriate impurity ions so that predetermined values of resistivity can be obtained. This doping is usually carried out by implanting phosphorus (P) ions to facilitate the feasibility of the predetermined values.

As illustrated in FIG. 7B, a first mask 6 is provided over both the resistor and the region where a PMOS transistor 18 is to be formed. Subsequently, to dope the area of the polysilicon layer exposed by the first mask 6, a doping step is carried out with a high concentration of P ions either by ion implant or thermal diffusion process at from 900° to 1000° C. As the mask 6, a photoresist layer is conventionally used for the ion implant, while a silicon oxide layer is used for the thermal diffusion process. By this heavy P doping, the exposed portion of the polysilicon layer 5 turns to an $N^+$ polysilicon layer 7.

By subjecting the polysilicon layers 5 and 7 to a patterning process using the conventional photolithography technology, a gate electrode 7a of NMOS transistor 16, gate electrodes 7b and 5 of PMOS transistors, and a resistor layer 5 are defined, as shown in FIG. 7C. Subsequently, a second mask 10 is provided to cover a predetermined portion except for the NMOS transistor 16 to be formed, and a high concentration of N-type impurities are doped to form source and drain regions 14 and 14 of the NMOS transistor 16.

Referring to FIG. 7D, a third mask 11 is provided to cover a predetermined portion except for the PMOS transistors 17 and 18 to be formed, and a high concentration of P-type boron impurities are doped to form source and drain regions 15 and 15 of the PMOS transistors 17 and 18, and the gate electrode 9 of PMOS 18.

To proceed with the miniaturization of the MOS transistor devices, the reduction in short channel effects is quite important. This may be carried out effectively by forming relatively shallow junctions for source and drain regions.

It has been known that although the source and drain regions may generally be formed for PMOS transistors by doping either B ions or $BF_2$ ions, the latter ions are preferred for forming shallow junction regions and resulting in greater reduction in the short channel effects.

As described earlier, however, in the prior art ion implant process which has been carried out simultaneously into source and drain regions 15 and 15 and gate electrode 9, $BF_2$ ions may not be selected for this ion implanting step for the following reasons:

When $BF_2$ ions are used for a heavy doping into a gate electrode region, this doping is known to give rise to (1) a reduction of threshold voltages caused by B ions which reach even to a channel region by the enhanced diffusion effect assisted by the presence of F ions, and (2) the reduced reliability of a gate electrode 3 caused by a relatively large amount of B ions diffused into the gate electrode.

Accordingly, $BF_2$ ions can not be used for this doping step, and it has been difficult to form shallow source and drain regions 15 and 15 on the surface of the semiconductor substrate, thereby resulting in an unwanted increase in the short channel effects.

In addition, to fabricate a PMOS transistor having a withstand voltage on the order of 10 V, in general, the impurity concentration in the drain region has to be lowered, since a withstand voltage is primarily determined by the breakdown voltage caused by the field concentration at the edge of the drain.

However, the above-mentioned lowering of the impurity concentration gives rise to another problem for the PMOS device, in that, by the use of a P$^+$ polysilicon layer for the gate electrode of the PMOS device, the carrier depletion in the gate region is induced with relative ease by the lowered concentration.

In other words, this problem of the PMOS device arises when the impurity concentration is lowered in the interface region between P$^+$ polysilicon layer and gate oxide layer for the gate electrode, due to the following factors: (1) The carrier depletion is induced at the gate oxide side of the polysilicon layer, and (2) this results in an insufficient channel formation because of the unduly reduced electric field at the polysilicon (gate) electrode, thereby resulting in a decrease in transconductance (gm) of the PMOS transistor.

This problem may be obviated by optimizing the conditions for fabricating MOS transistors, such as concentration and distribution of the impurities, and the conditions may vary depending on, among others, the thickness of the polysilicon layer. For the polysilicon layer thickness of about from 300 to 400 nm, for example, the appropriate conditions may preferably be achieved by carrying out an implant with ions of a concentration of approximately from $2\times10^{15}$ to $3\times10^{15}$ cm$^{-2}$ and a thermal annealing at temperatures approximately from 850° to 900° C. These conditions are chosen such that the implanted ions will not penetrate through the gate oxide layer.

However, these conditions have not been achieved by prior process steps as described earlier. Therefore, the impurity concentration at the drain edge has not been optimized, and withstand voltages high enough for practical use have not been achieved for the MOS transistors.

SUMMARY OF THE INVENTION

The general purpose of this invention is therefore to provide improved process steps for fabricating MOS transistors, having most, if not of all, of the advantages and features of similar employed related steps, while eliminating many of the aforementioned disadvantages of other related process steps.

Accordingly, one object of this invention is to overcome the above-described limitations of the conventional fabrication process. This and other objects are addressed by the present invention.

In one embodiment of the present invention, a method of the fabrication include the steps of (a) forming a gate oxide layer on the major surface of a silicon substrate;

(b) forming a polysilicon layer over the gate oxide layer;

(c) providing a first mask thereon to cover a predetermined portion except the portion for an N-type polysilicon layer to be formed;

(d) doping the polysilicon layer uncovered by the first mask with N-type ions;

(e) providing a second mask to cover a predetermined portion except the portion for a P-type polysilicon layer to be formed;

(f) doping the polysilicon layer uncovered by the second mask with boron ions; and (g) subjecting the polysilicon layer to a patterning process to define gate electrodes of an NMOS and PMOS transistors.

The step may include (h) providing a third mask to cover a predetermined portion except the portion for an NMOS transistor to be formed;

(i) doping N-type ions into substrate portion for the NMOS transistor to be formed using the third mask and the gate electrodes as a mask to thereby form a source and a drain of the NMOS transistor;

(j) forming a silicon oxide layer over each of the gate electrodes;

(k) providing a fourth mask thereon to cover a predetermined portion except the portion for a PMOS transistor to be formed; and (l) doping BF$_2$ ions into substrate portion for PMOS transistors to be formed using the fourth mask and gate electrodes overlaid by the silicon oxide layer as a mask, to thereby form sources and drains of the PMOS transistors, thereby forming MOS transistors.

The above-mentioned doping step (f) into the polysilicon layer with boron ions using the second mask is preferably carried out with ion energies of approximately from $1\times10^{15}$ to $5\times10^{15}$ cm$^{-2}$.

In addition, the process step (j) of forming the silicon oxide layer over each of the gate electrodes is achieved by oxidizing each surface area of the gate electrodes, concomitant with the heat treatment process for thermally activating implanted ions in the source and drain regions of the NMOS transistor.

In another embodiment of the present invention, in place of the above-described steps (h) through (l), a method may include:

(m) providing a third mask thereon to cover a predetermined portion except the portion for PMOS transistors to be formed;

(n) doping low concentration P-type ions into substrate portion for the PMOS transistors to be formed using the third mask and the gate electrodes as a mask to thereby form P$^-$ portions of sources and drains of LDD structure PMOS transistor;

(o) providing a fourth mask thereon to cover a predetermined portion except the portion for the NMOS transistor to be formed;

(p) doping N-type ions into the substrate portion for the NMOS transistor to be formed using the fourth mask and the gate electrode as a mask to thereby form a source and a drain of the NMOS transistor;

(q) providing a fifth mask thereon to cover a predetermined portion except the portion for PMOS transistors to be formed and to cover the portion within a predetermined distance from the edge of the gate electrodes of the PMOS transistors; and (r) doping P-type ions into substrate portion for the PMOS transistors to be formed using the fifth mask to thereby form P$^+$ portions of sources and drains of PMOS transistors, thereby forming the NMOS transistor and PMOS transistors in the LDD structure.

In the present invention, the use of BF$_2$ ions at the doping step for forming the source and drain regions becomes feasible, since (1) two doping steps, one into the polysilicon layer where gate electrodes are to be formed and the other into the source and drain regions, may be carried out separately and (2) the polysilicon layer is covered by the oxide layer prior to the formation of the source and drain regions to thereby block $BF_2$ ions from the P+ polysilicon layer.

Therefore, by the fabrication process of the present invention, low threshold voltage PMOS transistor devices which have device characteristics such as, for example, reduced short channel effects and high withstand voltages achieved by the incorporation of the LDD structure, have become feasible. This process for fabricating the MOS devices is applicable also to BiCMOS LSI, as well as CMOS LSI fabrication.

BRIEF DESCRIPTION OF THE DRAWINGS

The present invention together with its various features and advantages, can be more easily understood from the following more detailed description taken in conjunction with the accompanying drawings in which:

FIG. 4 is a graph showing the change in transconductance values and flat band shifts as a function of B dose implanted into the polysilicon layer of a PMOS transistor device;

FIG. 5 is a graph showing the change in diffusion lengths of the source and drain along the channel direction as a function of B dose for a PMOS transistor device;

DESCRIPTION OF THE ILLUSTRATIVE EMBODIMENTS

Figure 1A:
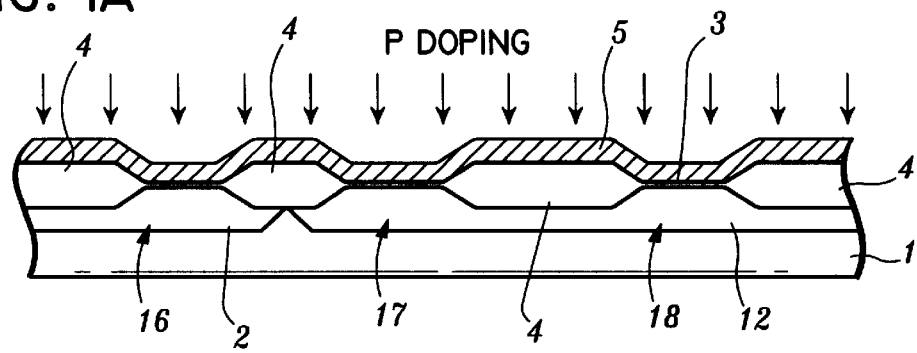
FIGS. 1A through 2B are cross-sectional views of MOS transistor devices in accordance with a first embodiment of the present invention during various stages in the fabrication process.

In the description which follows, specific embodiments of the invention particularly useful in MOS transistor applications are described. It is understood, however, that the invention is not limited to these embodiments. For example, it is appreciated that the structure and methods for fabrication of MOS transistor devices are adaptable to any form of semiconductor device. Other embodiments will be apparent to those skilled in the art.

Referring to FIGS. 1A through 2B, there will be described methods, compatible with the CMOS process for fabricating MOS transistors for use for analogue circuit applications, with the following embodiments of the present invention. In the following description, the fabrication of resistor layers for analogue circuits are included, and like reference numerals refer to like elements.

A fabrication method of MOS transistors of the present invention includes the steps of forming a polysilicon layer, having an underlying gate oxide layer on the major surface of a silicon substrate, providing a mask to cover a predetermined portion except the portion for an N-type polysilicon layer to be formed, doping the polysilicon layer uncovered by the first mask with N-type ions, providing a second mask to cover a predetermined portion except the portion for a P-type polysilicon layer to be formed, doping the polysilicon layer uncovered by the second mask with boron ions, and subjecting the polysilicon layer to a patterning process to define gate electrodes of an NMOS and PMOS transistors.

The steps may include
providing a third mask to cover a predetermined portion except the portion for an NMOS transistor to be formed, doping N-type ions into the substrate portion for the NMOS transistor to be formed using the third mask and the gate electrodes as a mask to thereby form a source and a drain of the NMOS transistor, forming a silicon oxide layer over each of the gate electrodes, providing a fourth mask to cover a predetermined portion except the portion for a PMOS transistor to be formed, and doping $BF_2$ ions into the substrate portion for PMOS transistors to be formed using the fourth mask and gate electrodes overlaid by the silicon oxide layer as a mask, to thereby form source and drain regions of the PMOS transistors.

To be more specific, the first embodiment of the present invention is described with reference to FIGS. 1A through 2B, which are cross sectional views of the MOS transistors during various stages in the fabrication process according to a first embodiment of this invention.

Referring now to FIG. 1A, there are formed P-well and N-well regions 16 and 18 on a silicon substrate 1 in the regions 16, 17 and 18 where NMOS and PMOS transistors are to be formed, respectively.

A field oxide layer 4 of silicon oxide for isolation is then formed on a main surface of the well regions by the conventional LOCOS process, in which openings for the NMOS and PMOS regions are defined using an oxidation mask film (not shown). Thereafter, a gate oxide layer 3 is formed, wherein channel doping is carried out so as to control threshold voltages of each MOS transistor.

Subsequently, a layer of polysilicon 5 for forming gate electrodes is disposed on the gate oxide layer 3 by chemical vapor deposition (CVD). Since this polysilicon layer is also utilized as a resistor for an analogue circuit which will be described hereinbelow, the entire surface of the polysilicon layer 5 is doped with appropriate impurity ions so that predetermined values of resistivity may be obtained. To facilitate the feasibility of the predetermined resistivity values, this doping is carried out by implanting phosphorus (P) ions with an energy of approximately from 30 to 50 keV and an ion dose of approximately from $1 \times 10^{14}$ to $5 \times 10^{14}$ cm$^{-2}$ in the present embodiment.

Figure 1B:
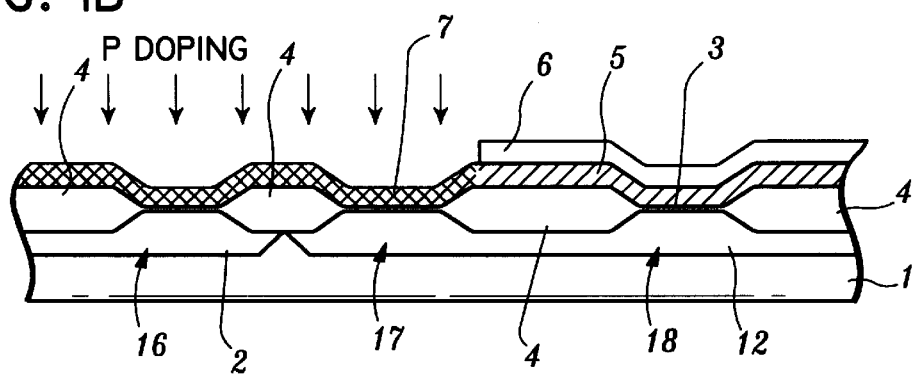

As illustrated in FIG. 1B, a first mask 6 is provided over the regions where the resistor and a PMOS transistor 18 are to be formed. Subsequently, to dope the area of the polysilicon layer exposed by the first mask 6, a doping step is carried out with a high concentration of P ions either by ion implant or thermal diffusion process at from 900° to 1000° C. As the mask 6, a photoresist layer is used for the ion implant, while a silicon oxide layer is used for the thermal diffusion process.

In the present embodiment, this P ion doping is carried out by implanting ions with an energy of approximately from 30 to 50 keV and an ion dose of approximately from $5 \times 10^{15}$ to $1 \times 10^{16}$ cm$^{-2}$ and the exposed portion of the polysilicon layer 5 turns to an N+ polysilicon layer 7, from which an N-type gate electrode 7a is to be formed.

Figure 1C:
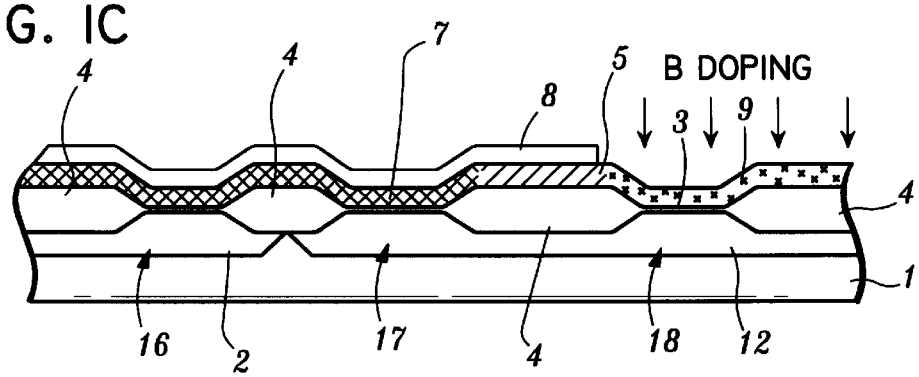

As illustrated in FIG. 1C, a mask 8 is subsequently provided to cover a predetermined portion except the portion 18 for the PMOS to be formed, and a doping step into the area of the polysilicon layer 5 uncovered by the mask 8 is carried out with B ions to form the region of the polysilicon layer, from which a P-type gate electrode 9 is to be formed.

The appropriate conditions for this doping step are determined primarily by considering (1) a desirable impurity concentration in the P-type gate electrode 9 such that the carrier depletion is not caused in the electrode region contiguous to the channel region, (2) an appropriate annealing temperature so that the impurities do not penetrate through the gate oxide layer to the channel region, without considering so much the concentration in the source and drain regions of the PMOS, since the impurity concentration of these regions can be adjusted at a later process step. Therefore, the optimum impurity concentration in the P-type gate electrode can be achieved by the present doping step.

Figure 7A:
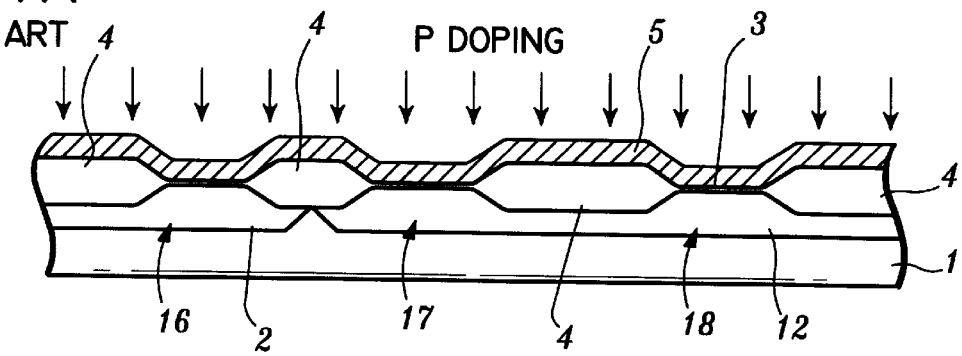
FIGS. 7A through 7D are cross-sectional views of MOS transistor devices during various stages of a prior art fabrication process.
Figure 7B:
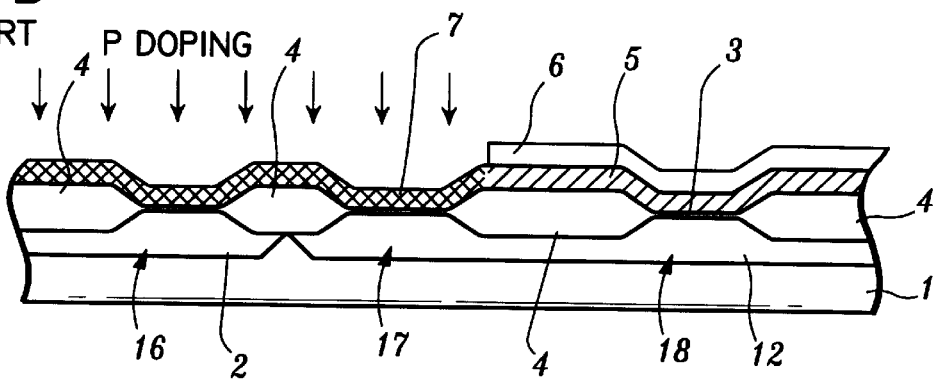
Figure 7C:
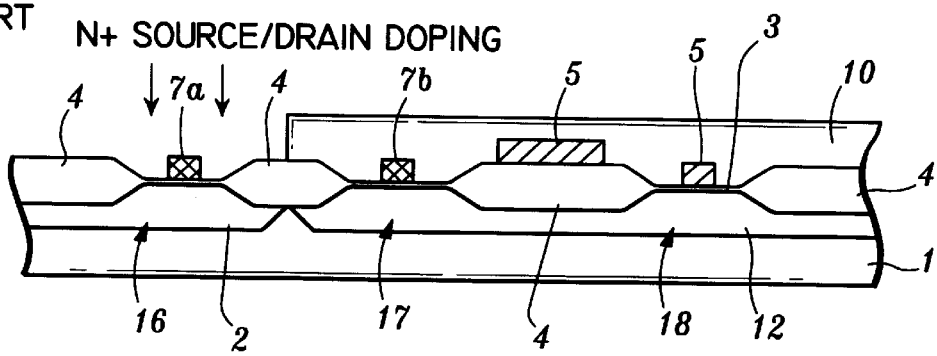
Figure 7D:
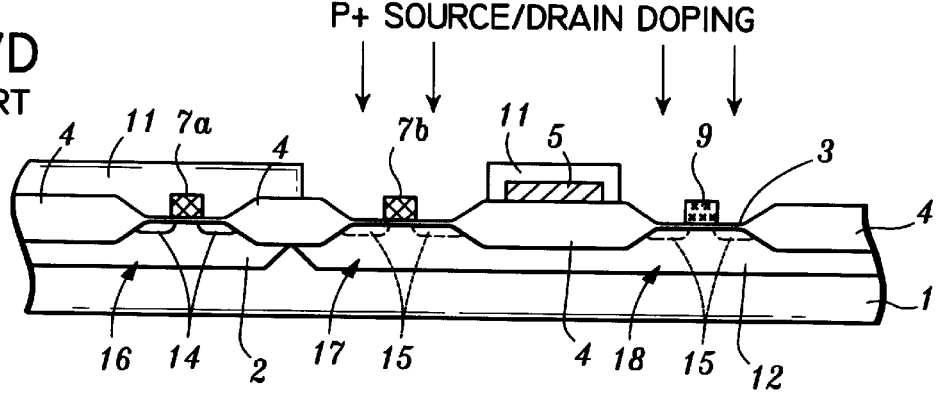

This can be compared to the ion implant in the prior art fabrication process, wherein a doping step is carried out, at a rather finishing step of the fabrication, simultaneously into source and drain regions 15 and 15 and gate electrode 9 (FIG. 7D), and the ion dose has to be determined by considering the concentration of both the source, drain and gate electrode, thereby causing the aforementioned difficulties in optimizing the impurity concentration and annealing temperature for the gate electrode, source and drain regions.

The B ion implant is carried out in this embodiment preferably with an energy of approximately from 10 to 30 keV and an ion dose of approximately from $1 \times 10^{15}$ to $5 \times 10^{15}$ cm$^{-2}$. By this B implant, the exposed portion of the polysilicon layer 5 turns to a P$^+$ polysilicon layer 9, from which a P-type gate electrode 7a is to be formed.

Figure 1D:
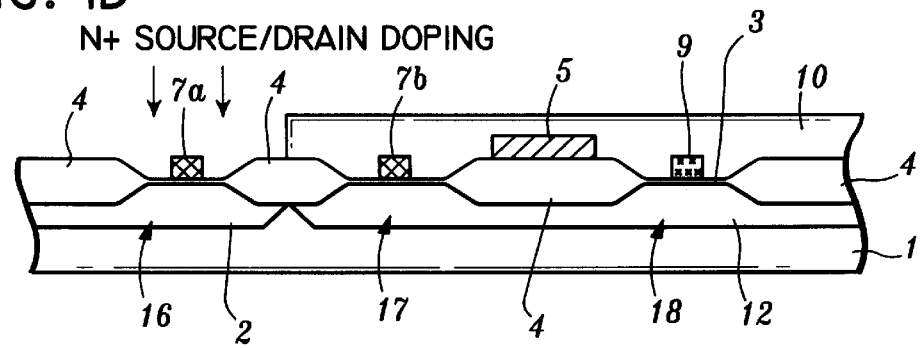

The portions of polysilicon layers 5, 7 and 9 are subjected to a patterning process using the conventional photolithography technology, a gate electrode 7a of NMOS transistor 16, and thus gate electrodes 7b and 9 of PMOS transistors 17 and 18 and a resistor layer 5 are defined, as shown in FIG. 1D. Subsequently, to form source and drain regions 14 and 14 of the NMOS transistor 16, a third mask 10 is provided to cover a predetermined portion except the portion 16 for the NMOS to be formed, and a high concentration of N-type impurities are doped and annealed to activate doped ions. This doping step is carried out by implanting P ions with an energy of approximately 50 keV and an ion dose of approximately $5 \times 10^{15}$ cm$^{-2}$.

During the thermal annealing step, an oxide layer 13 (FIG. 2A) is grown through the impurity enhanced growth, on the N$^+$ portion of the polysilicon layer 9 to have a thickness of approximately 100 nm. This oxide layer is used to block BF$_2$ ions which are doped into the P$^+$ polysilicon layer at a following process step. The oxide layer 13 is grown also on the P$^+$ portions 7a, 7b and 5 of the polysilicon layer 9.

Figure 2A:
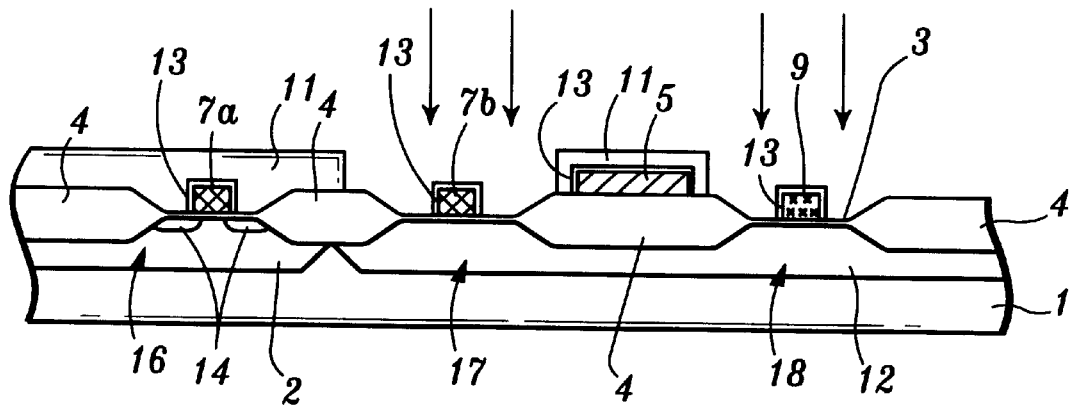

Referring to FIG. 2A, a fourth mask 11 is provided to cover a predetermined portion except the portion for the PMOS transistors 17 and 18 to be formed, and BF$_2$ ions are implanted to form source and drain regions of the PMOS transistor 18, having a high P-type ion concentration. This BF$_2$ ion implant step is carried out preferably with an energy of approximately from 30 to 50 keV and an ion dose of approximately from $2 \times 10^{15}$ to $3 \times 10^{15}$ cm$^{-2}$. The thermal activation of the implanted BF$_2$ ions in the source and drain regions 15 and 15 may preferably be carried out concurrently with a succeeding reflow process step, to thereby result in relatively shallow junction regions.

Figure 2B:
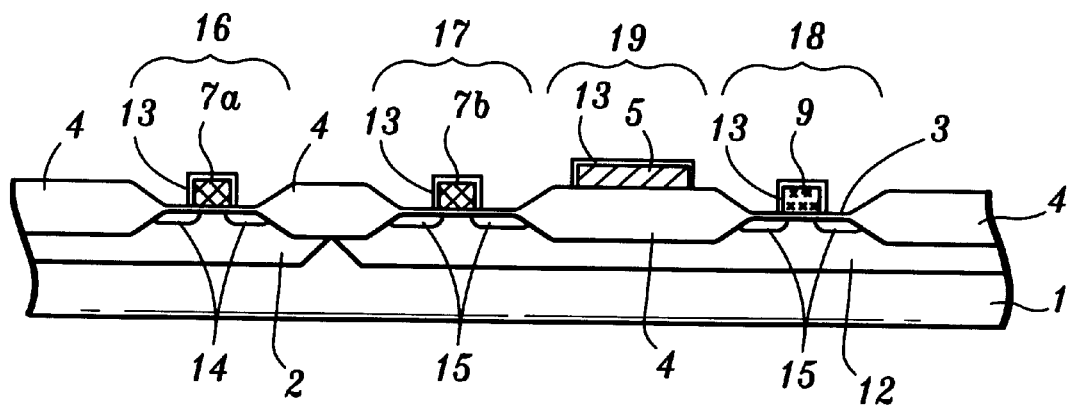

As illustrated in FIG. 2B, the NMOS 16 and PMOS transistors 17 and 18 and polysilicon resistor 19 are fabricated through the fabrication steps described above, which are utilized for the formation of an integrated analogue circuit.

For the analogue circuit applications, PMOS transistors with high withstand voltages are often required. In the following description of a second embodiment, there are described process steps for fabricating these MOS transistors, wherein PMOS transistors with lightly doped drain (LDD) structure are fabricated using masks.

In the present second embodiment, the fabrication steps up to the formation of a gate electrode 7a of NMOS transistor 16, gate electrodes 7b and 9 of PMOS (FIG. 3A) are carried out in a similar manner to the previous embodiment (FIG. 1A through a portion of FIG. 1D), and succeeding steps will be described hereinbelow.

Figure 3A:
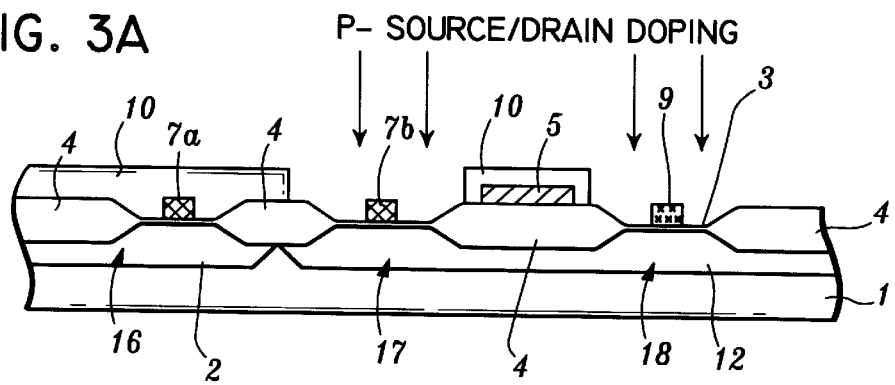
FIGS. 3A through 3D are cross-sectional views of MOS transistor devices in accordance with another embodiment of the present invention during various stages in the fabrication process.

Referring to FIG. 3A, a mask 10 is provided to cover a predetermined portion except the portion for the PMOS transistors 17 and 18 to be formed, and B ions are subsequently implanted to form P-portions 15a of source and drain regions of the PMOS transistors 17 and 18. The conditions for B ion implant preferably selected in this process step are an energy of approximately 30 keV and an ion dose of approximately $5 \times 10^{12}$ cm$^{-2}$. With the P-portions formed at the drain edge portion of the MOS transistor, the aforementioned field concentration can be relaxed and higher withstand voltages can thereby be achieved.

Figure 3B:
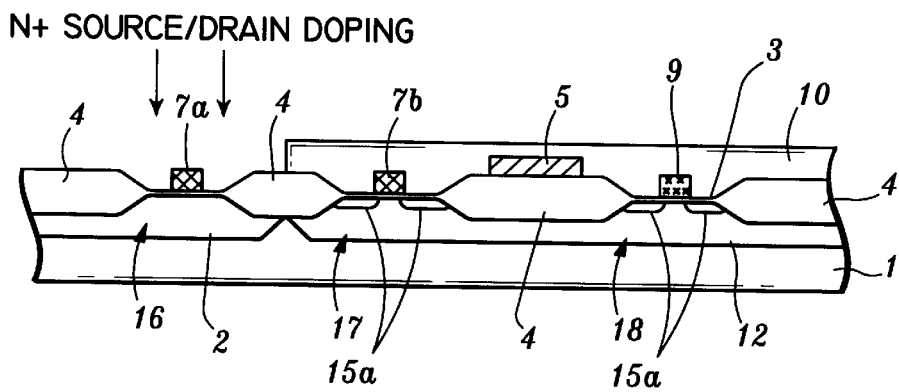

Referring to FIG. 3B, a mask 10a is provided to cover a predetermined portion for the NMOS transistors 16 to be formed, and N-type ions of a high concentration are doped to form source and drain regions of the NMOS transistor 16, followed by a thermal annealing for activating these ions.

The P ion implant in this process step is carried out preferably with an energy of approximately 50 keV and an ion dose of approximately from $5 \times 10^{15}$ cm$^{-2}$.

During the thermal annealing process, an oxide layer 13 is grown through impurity enhanced growth on the N$^+$ portion of the polysilicon layer 9 to have a thickness of approximately 100 nm. The oxide layer 13 is grown also on the P$^+$ portions 7a, 7b and 5 of the polysilicon layer 9.

Figure 3C:
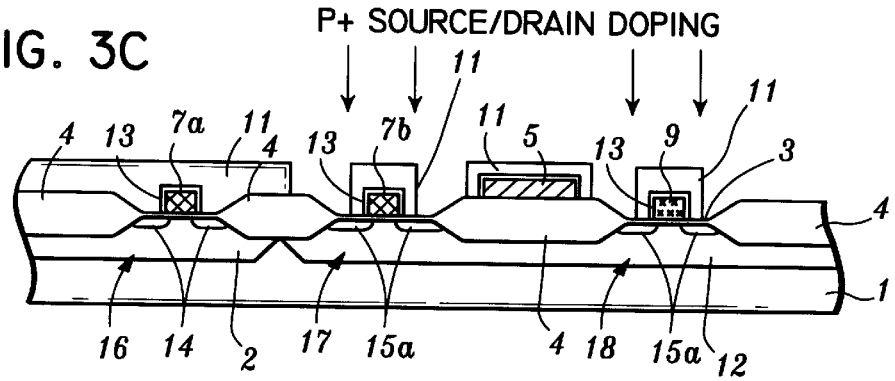

Referring to FIG. 3C, a mask 11 is provided to cover a predetermined portion where the PMOS transistors 17 and 18 are to be formed and to cover the portions of the channel region within a predetermined distance from the edge of the gate electrodes 7b and 9. Subsequently, BF$_2$ ions are implanted using the mask 11 to form the P$^+$ portions in the source and drain regions of the LDD structure PMOS transistors 17 and 18. The BF$_2$ ion implant is carried out preferably with an energy of approximately from 30 to 50 keV and an ion dose of approximately from $2 \times 10^{15}$ to $3 \times 10^{15}$ cm$^{-2}$.

As described earlier, although the oxide layers 13 are grown through the impurity enhanced growth on the N$^+$ portion 7a and P$^+$ portions 7b and 5 of the polysilicon layer 9, the widths of these layers do not primarily determine the positions of the P$^+$ portions in the source and drain regions, because these positions are positively determined by the above-mentioned mask 11 which is provided at the succeeding step, covering the oxide layer 13.

Figure 3D:
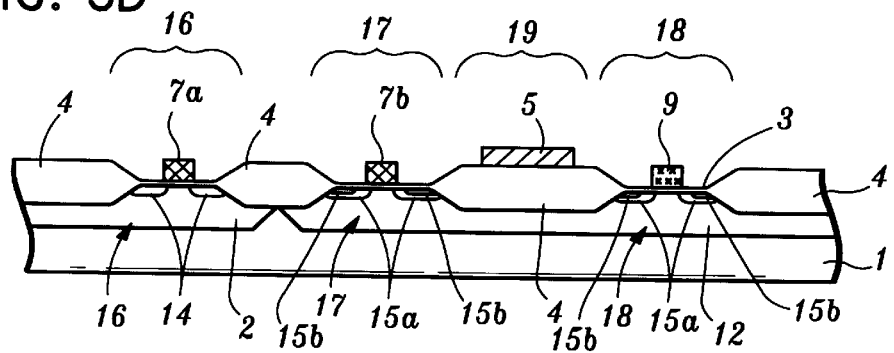

As illustrated in FIG. 3D, the NMOS transistor 16 and LDD structure PMOS transistors 17 and 18 are thus fabricated through the fabrication steps described above. These MOS transistors together with the resistor 19 may preferably be utilized for the formation of an integrated analogue circuit.

Although the above-mentioned LDD structure MOS transistors are not entirely compatible with the miniaturization of IC devices due to their relatively large device area required, the transistors may be utilized by being properly mounted on IC circuits together with non-LDD structure devices to accomplish high withstand voltages and to thereby improve the circuit capability as a whole.

Device characteristic values are measured for the PMOS transistor devices fabricated through the process steps illustrated in FIGS. 1 and 2, and compared to those obtained for the devices fabricated through the prior process in FIG. 7. These PMOS devices have been fabricated for use in analogue CMOS components, including a gate oxide layer of 25 nm thickness and a polysilicon layer of 400 nm, and having a threshold voltage of −0.4 V.

It has been known that a decrease in device reliability has resulted primarily from the penetration of B ions through the gate oxide 3 as described earlier and manifests itself as a flat band shift, while the carrier depletion in a gate region is represented by the decrease in transconductance gm.

The values obtained for the flat band shifts and gm are shown in FIG. 4. For the transistor device fabricated through the process of the present invention, the results indicate that appreciable decreases in either flat band shift or gm is not observed for an implanted B dose of approximately from $2 \times 10^{15}$ to $3 \times 10^{15}$ cm$^{-2}$, which is indicative of a preferable range for the device fabrication, while both of band shift and gm values decrease for the B dose outside of the above-mentioned range, indicating unsatisfactory range of the B dose. It is also observed from the measurements, that the preferable range of the B dose depends on device parameters such as, for example, the thickness of the polysilicon layer and the thermal annealing conditions.

The diffusion length of the source and drain along the channel direction are also compared for the devices fabricated by the prior art process to that by the process of the present invention. As shown in FIG. 5, the diffusion length $x_j$ of the former device is approximately from 0.35 to 0.45 $\mu$m. By contrast, the length of approximately from 0.2 to 0.25 $\mu$m can be accomplished for the device by the process of present invention through the aforementioned doping process step, in which $BF_2$ ions can be used, and, in addition, doping can be carried out with an ion dose independent from that for the implant into the gate electrode.

Figure 6:
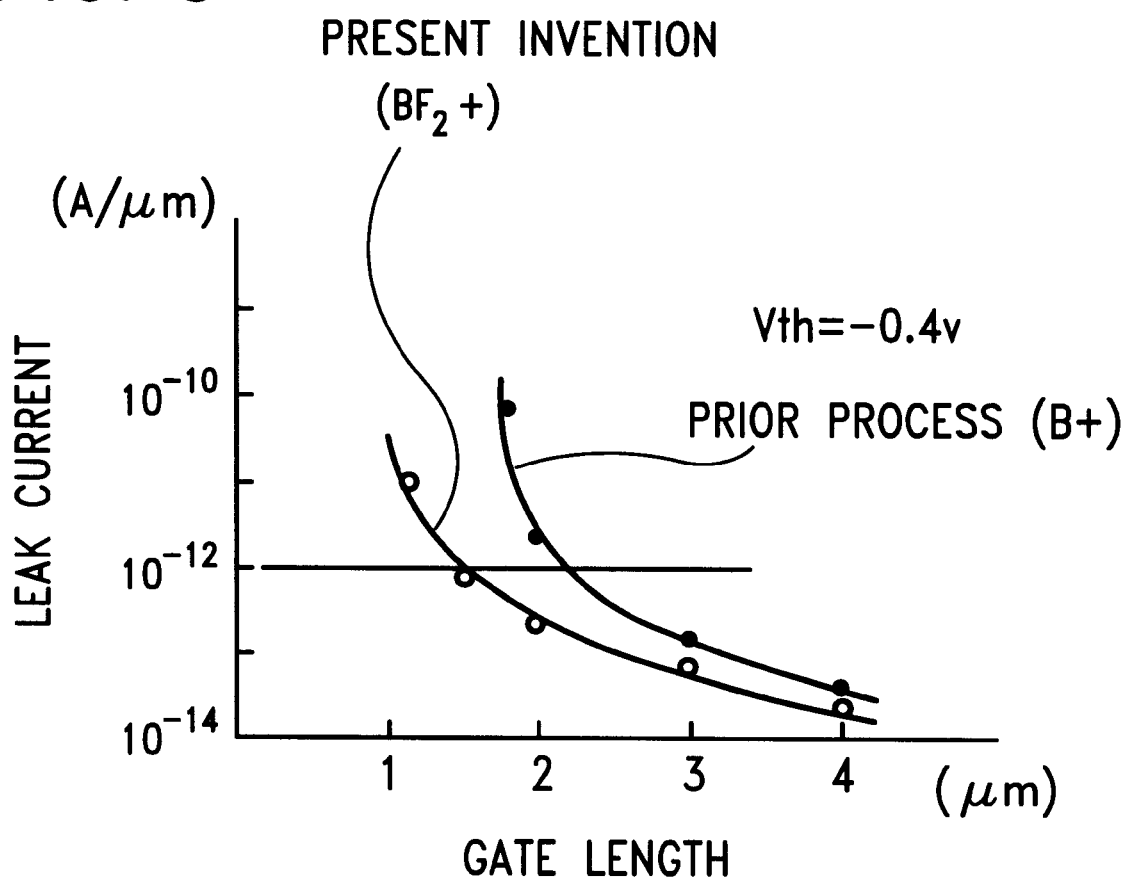
FIG. 6 is a graph showing the change in leakage currents as a function of channel lengths for a PMOS transistor device.

Furthermore, leakage current values are compared. As shown in FIG. 6, the results indicate that lower leakage current values are obtained for the device fabricated by the process of the present invention, and that the device miniaturization down to a gate length of approximately 1.5 gm may be feasible by the process of the present invention, when $1 \times 10^{-12}$ A/$\mu$m is taken as a criterion for the analogue device applications.

From the values mentioned just above, it is indicated that transistor device characteristics of the present invention as a whole have been improved over the devices fabricated through the prior art process.

It is noted that, although there have been described several optimized conditions for the process steps such as, for example, the ion implant, these conditions vary depending on other process conditions and the field of the device applications. For example, the ion species used in the ion implant into the NMOS source and drain region is not limited to P ions described earlier, but ions such as, for example, arsenic (As) ions may also be used.

Furthermore, although oxide layers on gate electrodes are formed by oxidizing surface areas of the gate electrodes, which is concomitant with the heat treatment process for thermally activating implanted ions in the source and drain regions of the NMOS transistors, the oxide layers may also be formed prior to the formation of the source and drain regions.

As described earlier, in the present invention, the use of $BF_2$ ions at the doping step for forming the source and drain regions becomes feasible, since (1) two doping steps, one into the polysilicon layer where gate electrodes are to be formed and the other into the source and drain regions, may be carried out separately and (2) the polysilicon layer is covered by the oxide layer prior to the formation of the source and drain regions to thereby be able to block $BF_2$ ions from the P$^+$ polysilicon layer.

Therefore, low threshold voltage PMOS transistor devices which have device characteristics such as, for example, reduced short channel effects and high withstand voltages achieved by the incorporation of the LDD structure, have become feasible by the present fabrication process of the present invention. This process for fabricating the MOS devices is applicable also to BiCMOS LSI, as well as CMOS LSI fabrication.

This application is based on Japanese Patent Application 9-108450, filed with the Japanese Patent Office on Apr. 25, 1997, the entire contents of which are hereby incorporated by reference.

Specific embodiments of the invention particularly useful in the MOS transistor applications have been described. However, it is to be understood that the above-described process steps are merely illustrative of the many possible specific embodiments which can be devised in accordance with these principles of the invention. Numerous and varied other steps can be devised in accordance with these principles by those skilled in the art without departing from the spirit and scope of the present invention.

What is claimed is:

1. A method for fabricating MOS transistors, comprising the steps of:

forming a gate oxide layer on a major surface of a silicon substrate;

forming a polysilicon layer over said gate oxide layer;

providing a first mask on said polysilicon layer to cover a predetermined portion except for a portion at which an N-type polysilicon layer is to be formed;

doping said polysilicon layer uncovered by said first mask with N-type ions, and removing said first mask upon completion of said doping step;

providing a second mask on said polysilicon layer to cover a predetermined portion except for a portion at which a P-type polysilicon layer is to be formed;

doping said polysilicon layer uncovered by said second mask with boron ions, and removing said second mask upon completion of said doping step;

subjecting said polysilicon layer to a patterning process to define gate electrodes of NMOS and PMOS transistors;

providing a third mask on said polysilicon layer to cover a predetermined portion except for a portion at which an NMOS transistor is to be formed;

doping N-type ions into the substrate corresponding to the portion at which said NMOS transistor is to be formed using said third mask and said gate electrodes as a mask to thereby form a source and a drain of said NMOS transistor, and removing said third mask upon completion of said doping step;

forming a silicon oxide layer over each of said gate electrodes;

providing a fourth mask on said silicon oxide layer to cover a predetermined portion except for a portion at which at least one PMOS transistor is to be formed; and doping $BF_2$ ions into the substrate corresponding to the portion at which said at least one PMOS transistor is to be formed using said fourth mask and gate electrodes overlaid by said silicon oxide layer as a mask, to thereby form sources and drains of said at least one PMOS transistor, and removing said fourth mask upon completion of said doping step.

2. The method according to claim 1, wherein said process step of forming said silicon oxide layer over each of said gate electrodes is achieved by oxidizing each surface area of said gate electrodes, concomitant with a heat treatment process for thermally activating implanted ions in said source and drain regions of said NMOS transistor.

3. The method according to claim 1, wherein said process step of doping said polysilicon layer uncovered by said second mask is carried out by implanting boron ions with an ion dose of approximately from $1\times10^{15}$ to $5\times10^{15}$ cm$^{-2}$.

4. A method for fabricating MOS transistors, comprising the steps of:

forming a gate oxide layer on a major surface of a silicon substrate;

forming a polysilicon layer over said gate oxide layer;

providing a first mask on said polysilicon layer to cover a predetermined portion except for a portion at which an N-type polysilicon layer is to be formed;

doping said polysilicon layer uncovered by said first mask with N-type ions, and removing said first mask upon completion of said doping step;

providing a second mask on said polysilicon layer to cover a predetermined portion except for a portion at which a P-type polysilicon layer is to be formed;

doping said polysilicon layer uncovered by said second mask with boron ions, and removing said second mask upon completion of said doping step;

subjecting said polysilicon layer to a patterning process to define gate electrodes of NMOS and PMOS transistors;

providing a third mask on said polysilicon layer to cover a predetermined portion except for a portion at which at least one PMOS transistor is to be formed;

doping low concentration P-type ions into the substrate corresponding to the portion at which said at least one PMOS transistor is to be formed using said third mask and said gate electrodes as a mask to thereby form P$^-$ portions of sources and drains of LDD structure PMOS transistor, and removing said third mask upon completion of said doping step;

providing a fourth mask on said polysilicon layer to cover a predetermined portion except for a portion at which said NMOS transistor is to be formed;

doping N-type ions into the substrate corresponding to the portion at which said NMOS transistor is to be formed using said fourth mask and said gate electrode as a mask to thereby form a source and a drain of said NMOS transistor, and removing said third mask upon completion of said doping step;

providing a fifth mask on said polysilicon layer to cover a predetermined portion except the portion at which said at least one PMOS transistor is to be formed and to cover the portion within a predetermined distance from an edge of said gate electrodes of said at least one PMOS transistor; and doping P-type ions into the substrate corresponding to the portion at which said at least one PMOS transistor is to be formed using said fifth mask to thereby form P$^+$ portions of sources and drains of said at least one PMOS transistor, and removing said fifth and sixth masks upon completion of said doping step, thereby forming said NMOS transistor and at least one PMOS transistor in an LDD structure.

5. The method according to claim 4, wherein said process step of doping said polysilicon layer uncovered by said second mask is carried out by implanting boron ions with an ion dose of approximately from $1\times10^{15}$ to $5\times10^{15}$ cm$^{-2}$.

* * * * *